United States Patent [19]
Zhou

[11] Patent Number: 5,923,185
[45] Date of Patent: Jul. 13, 1999

[54] LOGIC CIRCUIT PROGRAMMABLE TO IMPLEMENT AT LEAST TWO LOGIC FUNCTIONS

[75] Inventor: Shi-dong Zhou, Milpitas, Calif.

[73] Assignee: Xilinx, Inc., San Jose, Calif.

[21] Appl. No.: 08/815,095

[22] Filed: Mar. 12, 1997

[51] Int. Cl.$^6$ .............................................. H03K 19/094
[52] U.S. Cl. ........................................... 326/50; 326/119
[58] Field of Search ............................... 326/49, 50, 113, 326/54, 55, 37, 112, 119, 121, 52

[56] References Cited

U.S. PATENT DOCUMENTS 5,251,169 10/1993 Josephson .................................. 365/72
5,598,115 1/1997 Holst ....................................... 326/121

*Primary Examiner*—Michael Tokar
*Assistant Examiner*—Qui Van Duong
*Attorney, Agent, or Firm*—Edel M. Young; E. Eric Hoffman, Esq.

[57] ABSTRACT

The present invention provides a logic circuit that is programmable to implement a first logic function or a second logic function using as few as four transistors. In one embodiment, the logic circuit includes a first transistor, a second transistor, a third transistor, a fourth transistor, a first signal line for receiving a first input signal, a second signal line for receiving a second input signal, a control signal line for receiving a control signal, and an output signal line for receiving an output signal. The first transistor and the second transistor are connected in series between the control signal line and the output signal line. The third transistor is connected in series between the first input signal line and the output signal line. The fourth transistor is connected in series between the second input signal line and the output signal line. In addition, the first signal line is connected to the gates of the first and fourth transistors, and the second signal line is connected to the gates of the second and third transistors. The state of the control signal provided to the control signal line determines whether the logic circuit implements the first logic function or the second logic function. The first and second logic functions can be (1) an exclusive NOR function or an AND function; or (2) an OR function or an exclusive OR function.

9 Claims, 6 Drawing Sheets

LOGIC CIRCUIT PROGRAMMABLE TO IMPLEMENT AT LEAST TWO LOGIC FUNCTIONS

FIELD OF INVENTION

The present invention relates to a programmable circuit and, in particular, to a logic circuit that is programmable to implement a first logic function or a second logic function using as few as four transistors.

BACKGROUND OF THE INVENTION

FIG. 1 is a schematic diagram of a conventional circuit 100 for providing an exclusive NOR function or an AND function. Circuit 100 includes 2-input exclusive NOR (XNOR) gate 104, 2-input AND gate 108, and two-to-one multiplexer 110. XNOR gate 104 is a standard gate which provides a logic exclusive NOR function. AND gate 108 is a standard gate which provides a logic AND function. Both XNOR gate 104 and AND gate 108 receive input signals from lines 120 and 122. XNOR gate 104 provides an output signal on line 126 and AND gate 108 provides an output signal on line 136.

The output signal line 126 of XNOR gate 104 is connected to the "0" input terminal of multiplexer 110. The output signal line 136 of AND gate 108 is connected to the "1" input terminal of multiplexer 110.

The signal on output signal line 114 of multiplexer 110 may be equal to the output signal provided by XNOR gate 104 or the output signal provided by AND gate 108, depending on the status of the select signal on select signal line 118 of multiplexer 110. When the select signal applied to select signal line 118 is in a logic low state (e.g., 0 volts), the signal at the "0" input terminal of multiplexer 110 is supplied to output signal line 114 of multiplexer 110. Conversely, when the select signal applied to select signal line 118 is in a logic high state (e.g., 5 volts), the signal line 118 is in a logic high state (e.g., 5 volts), the signal at the "1" input terminal of multiplexer 110 is supplied to output signal line 114 of multiplexer 110. Accordingly, a select signal having a logic low state causes circuit 100 to implement an exclusive NOR function, and a select signal having a logic high state causes circuit 100 to implement an AND function.

FIG. 2 is a schematic diagram of XNOR gate 104 of FIG. 1, which is implemented using four transistors. XNOR gate 104 includes inverter 144 (which requires two transistors) and two transistors 150 and 154. Output signal line 126 connects to input terminal "0" of multiplexer 110 (FIG. 1).

FIG. 3 is a schematic diagram of AND gate 108 of FIG. 1, which is implemented using six transistors. AND gate 108 is formed by inverting the output of a standard NAND gate with an inverter (a NOT gate). Accordingly, AND gate 108 includes six transistors 162, 164, 166, 168, 170 and 172. Output signal line 136 connects to input terminal "1" of multiplexer 110 (FIG. 1).

A standard implementation of circuit 100 as described above requires a significant number of transistors (i.e., 10 transistors for XNOR gate 104 and AND gate 108, and approximately four transistors for the implementation of multiplexer 110). Therefore, it would be desirable to have a logic circuit which is programmable to provide either an exclusive NOR function or an AND function and which requires fewer transistors than circuit 100.

FIG. 4 is a schematic diagram of a conventional circuit 180 for providing an exclusive OR function or an OR function. Circuit 180 includes 2-input OR gate 184, 2-input exclusive OR (XOR) gate 190, and two-to-one multiplexer 110. Fourteen transistors are typically required to implement circuit 180. More specifically, six transistors are required to implement OR gate 184, four transistors are required to implement XOR gate 190, and four transistors are required to implement 2-to-1 multiplexer 110. The implementation of logic circuit 180 therefore requires a significant number of transistors. It would therefore be desirable to have a logic circuit which is programmable to provide either an OR function or an exclusive OR function and which requires fewer transistors than circuit 180.

SUMMARY OF THE INVENTION

Accordingly, the present invention provides a logic circuit which is programmable to implement either a first logic function or a second logic function, using as few as four transistors. In one embodiment, the logic circuit includes a first transistor, a second transistor, a third transistor, a fourth transistor, a first signal line for receiving a first input signal, a second signal line for receiving a second input signal, a control signal line for receiving a control signal, and an output signal line for providing an output signal. The first transistor and the second transistor are connected in series between the control signal line and the output signal line. The third transistor is connected in series between the first input signal line and the output signal line. The fourth transistor is connected in series between the second input signal line and the output signal line. In addition, the first signal line is connected to the gates of the first and fourth transistors, and the second signal line is connected to the gates of the second and third transistors.

The state of the control signal provided to the control signal line determines whether the logic circuit implements the first logic function or the second logic function. Depending upon the conductivity types of the first, second, third and fourth transistors (i.e., n-channel or p-channel), the first and second logic functions can be (1) an exclusive NOR function and an AND function, or (2) an exclusive OR function and an OR function. Accordingly, the logic circuit implements an exclusive NOR function when the control signal is asserted in a first logical state, and an AND function when the control signal is asserted in a second logical state. Alternatively, the logic circuit implements an exclusive OR function when the control signal is asserted in a first logical state, and an OR function when the control signal is asserted in a second logical state. The logic circuit in accordance with this embodiment advantageously reduces the number of transistors required to programmably implement an exclusive NOR function and an AND function (or an exclusive OR function and an OR function) to as few as four transistors.

The present invention will be more fully understood in light of the following detailed description taken together with the drawings.

DETAILED DESCRIPTION OF THE INVENTION

Figure 5:
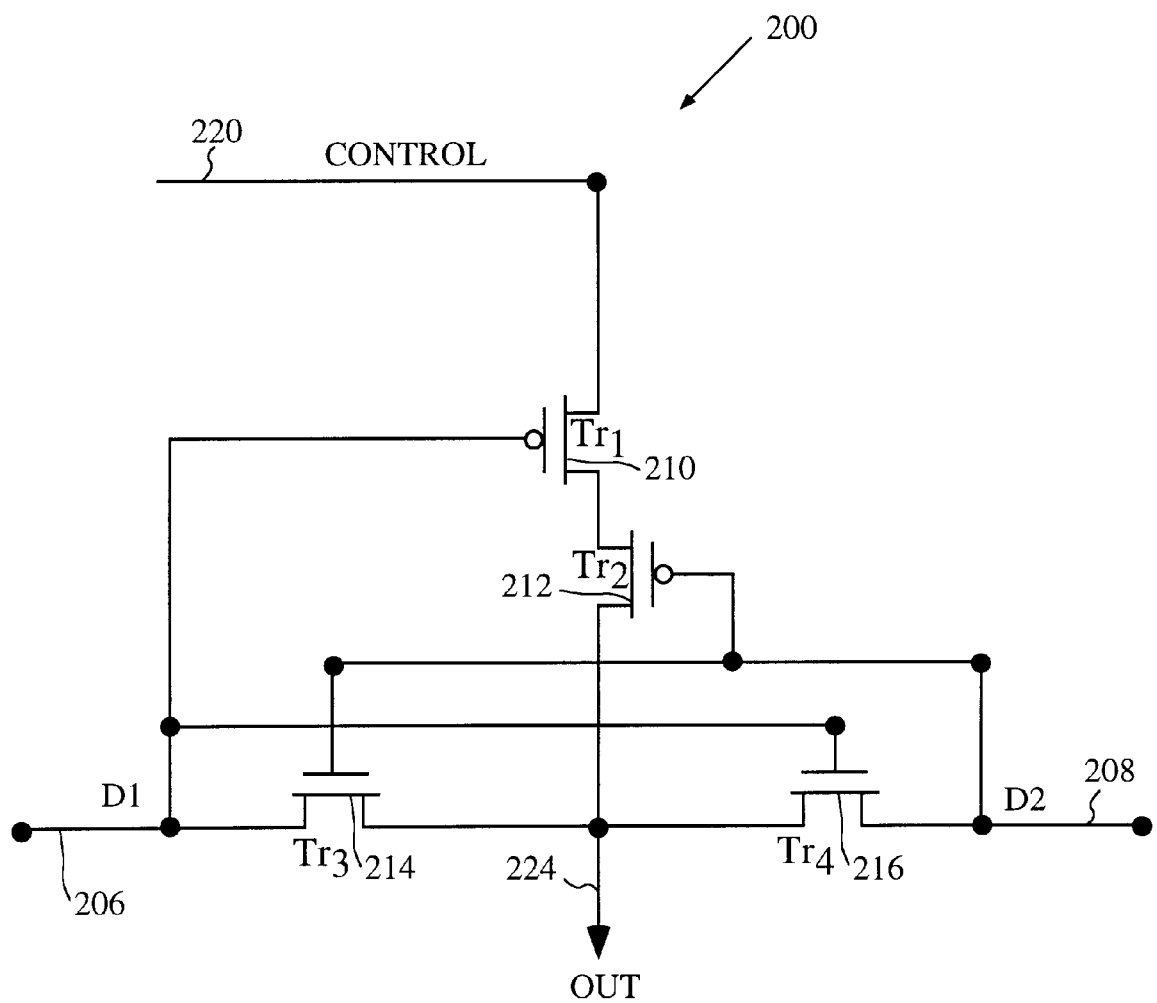
FIG. 5 is a schematic diagram of a programmable logic circuit for implementing an exclusive NOR function or an AND function in accordance with one embodiment of the present invention.

FIG. 5 is a schematic diagram of a programmable logic circuit 200 in accordance with one embodiment of the present invention. As described in more detail below, programmable logic circuit 200 can be programmed to implement an exclusive NOR function or an AND function. Programmable logic circuit 200 includes transistors 210, 212, 214 and 216. In the described embodiment, transistors 210 and 212 are p-channel field effect transistors, and transistors 214 and 216 are n-channel field effect transistors. Programmable logic circuit 200 receives input signals D1 and D2 on input signal lines 206 and 208, respectively, and transmits an output signal, OUT, on output signal line 224. Programmable logic circuit 200 also receives a control signal, CONTROL, on control signal line 220.

In particular, transistors 210 and 212 are connected in series between the control signal line 220 and output signal line 224. The gates of transistors 210 and 212 are connected to input signal lines 206 and 208, respectively. Transistor 214 is connected between input signal line 206 and output signal line 224. The gate of transistor 214 is connected to input signal line 208. Transistor 216 is connected between input signal line 208 and output signal line 224. The gate of transistor 216 is connected to input signal line 206.

The function of programmable logic circuit 200 is controlled by the state of the CONTROL signal. The state of the CONTROL signal is controlled, in turn, by control logic (not shown) which is defined by the user. The CONTROL signal can be set once or can be set dynamically during the normal operation of programmable logic circuit 200. Table 1 describes the output of programmable logic circuit 200 based on the state of the CONTROL signal, and the states of the D1 and D2 signals.

TABLE 1

| D1 | D2 | OUT (CONTROL = 0) | OUT (CONTROL = 1) |
|---|---|---|---|
| 0 | 0 | 0 | 1 |
| 0 | 1 | 0 | 0 |
| 1 | 0 | 0 | 0 |
| 1 | 1 | 1 | 1 |

As shown in Table 1, programmable logic circuit 200 implements an exclusive NOR function or an AND function depending on the state of the CONTROL signal. Thus, when the CONTROL signal is asserted in a logic low state (e.g., 0 volts), programmable logic circuit 200 provides an OUT signal which is an AND function of the D1 and D2 signals (i.e., programmable logic circuit 200 functions as an AND gate). Similarly, when the CONTROL signal is asserted in a logic high state (e.g., 5 volts), programmable logic circuit 200 provides an OUT signal which is the exclusive NOR of the D1 and D2 signals (i.e., programmable logic circuit 200 functions as an XNOR gate).

The operation of programmable logic circuit 200 will now be described in more detail. When the CONTROL signal is asserted in a logic high state, programmable logic circuit 200 performs an exclusive NOR function as follows. When both the D1 and D2 signals are in a logic low state, transistors 214 and 216 are turned off (i.e., in a non-conductive state), and transistors 210 and 212 are turned on (i.e., in a conductive state). As a result, a conductive path is formed between control signal line 220 and output signal line 224. Because the CONTROL signal is in a logic high state, an OUT signal having a logic high state is provided to output signal line 224.

When both the D1 and D2 signals are in a logic high state, transistors 210 and 212 are turned off, and transistors 214 and 216 are turned on. As a result, control signal line 220 is isolated from output signal line 224, and conductive pathways exist between input signal lines 206 and 208 and output signal line 224. Accordingly, both the D1 and D2 signals are routed to output signal line 224 through transistors 214 and 216 to provide an OUT signal having a logic high state at output signal line 224.

When the D1 signal is in a logic low state, and the D2 signal is in a logic high state, transistors 212 and 216 are turned off, and transistor 214 is turned on. As a result, control signal line 220 and input signal line 208 are isolated from output signal line 224, and a conductive pathway exists between input signal line 206 and output signal line 224. Accordingly, the D1 signal is routed to output signal line 224 through transistor 214 to provide an OUT signal having a logic low state at output signal line 224.

Similarly, when the D2 signal is in a logic low state, and the D1 signal is in a logic high state, transistors 210 and 214 are turned off, and transistor 216 is turned on. As a result, control signa line 220 and input signal line 206 are isolated from output signal line 224, and a conductive pathway exists between input signal line 208 and output signal line 224. Accordingly, the D2 signal is routed to output signal line 224 through transistor 216 to provide an OUT signal having a logic low state at output signal line 224.

When the CONTROL signal is asserted in a logic low state, programmable logic circuit 200 performs an AND function as follows. When both the D1 and D2 signals are in a logic low state, transistors 214 and 216 are turned off (i.e., in a non-conductive state), and transistors 210 and 212 are turned on (i.e., in a conductive state). As a result, a conductive path is formed between control signal line 220 and output signal line 224. Because the CONTROL signal is in a logic low state, an OUT signal having a logic low state is provided at output signal line 224.

When both the D1 and D2 signals are in a logic high state, transistors 210 and 212 are turned off, and transistors 214 and 216 are turned on. As a result, control signal line 220 is isolated from output signal line 224, and conductive pathways exist between input signal lines 206 and 208 and output signal line 224. Accordingly, both the D1 and D2 signals are routed to output signal line 224 through transistors 214 and 216 to provide an OUT signal having a logic high state at output signal line 224.

When the D1 signal is in a logic low state, and the D2 signal is in a logic high state, transistors 212 and 216 are turned off, and transistor 214 is turned on. As a result, control signal line 220 and input signal line 208 are isolated from output signal line 224, and a conductive pathway exists between input signal line 206 and output signal line 224. Accordingly, the D1 signal is routed to output signal line 224 through transistor 214 to provide an OUT signal having a logic low state at output signal line 224.

Similarly, when the D2 signal is in a logic low state, and the D1 signal is in a logic high state, transistors 210 and 214 are turned off, and transistor 216 is turned on. As a result, control signal line 220 and input signal line 206 are isolated from output signal line 224, and a conductive pathway exists between input signal line 208 and output signal line 224. Thus, the D2 signal is routed to output signal line 224 through transistor 216 to provide an OUT signal having a logic low state at output signal line 224.

Figure 1:
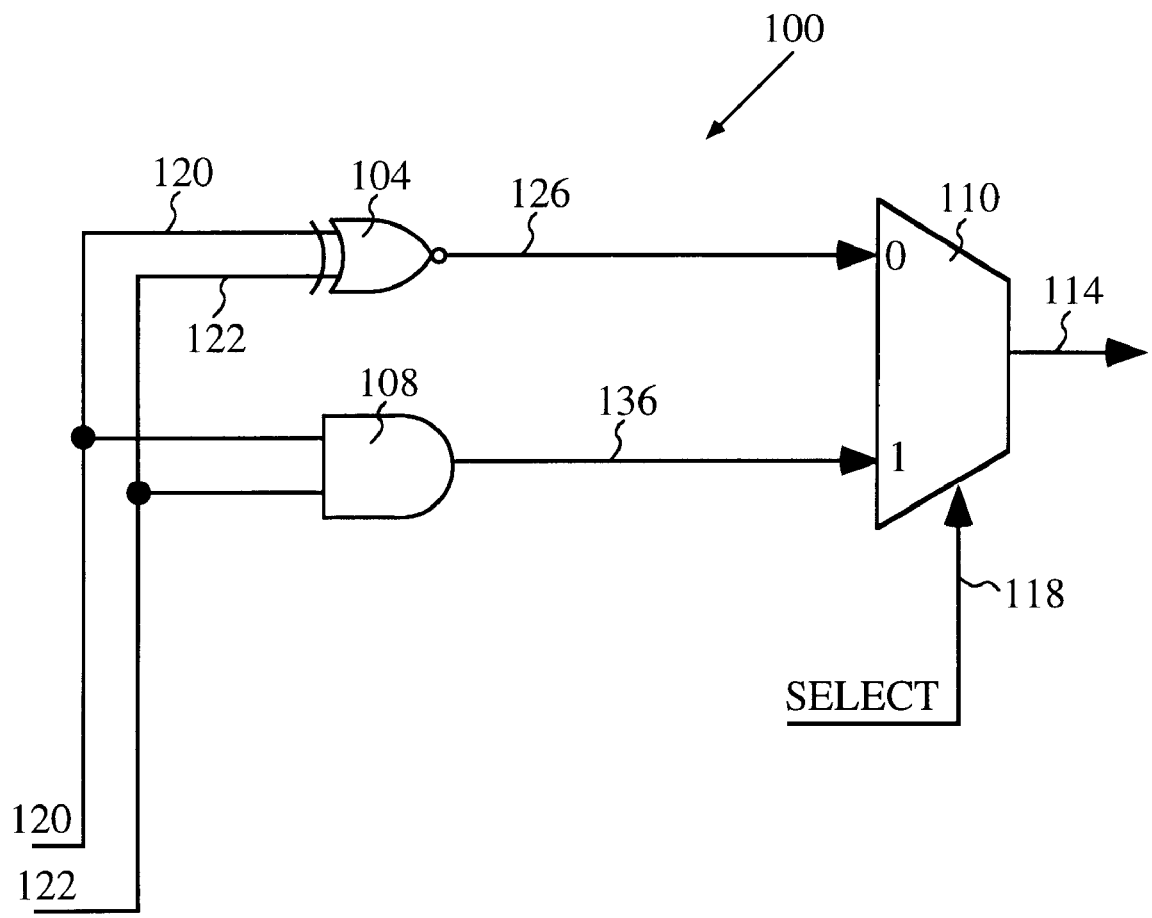
FIG. 1 is a schematic diagram of a conventional circuit for providing an exclusive NOR function or an AND function.
Figure 2:
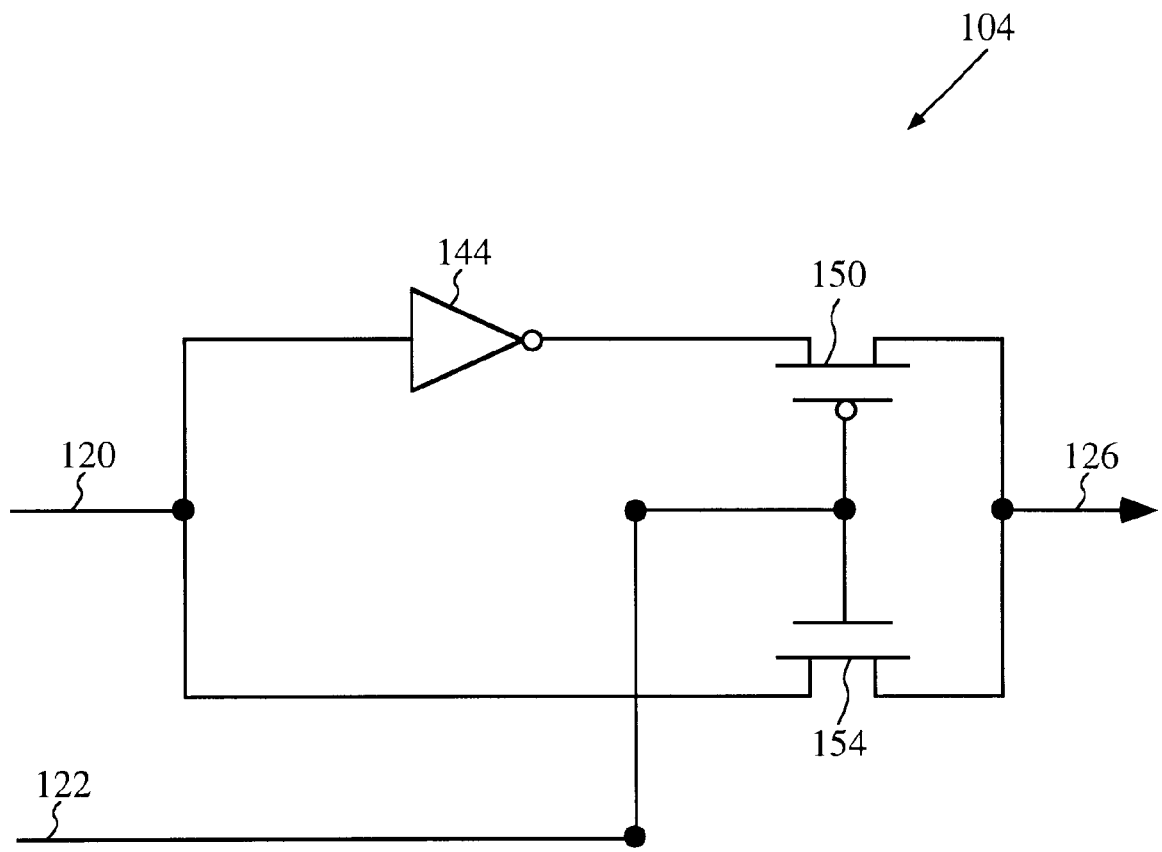
FIG. 2 is a schematic diagram of the XNOR gate of FIG. 1.
Figure 3:
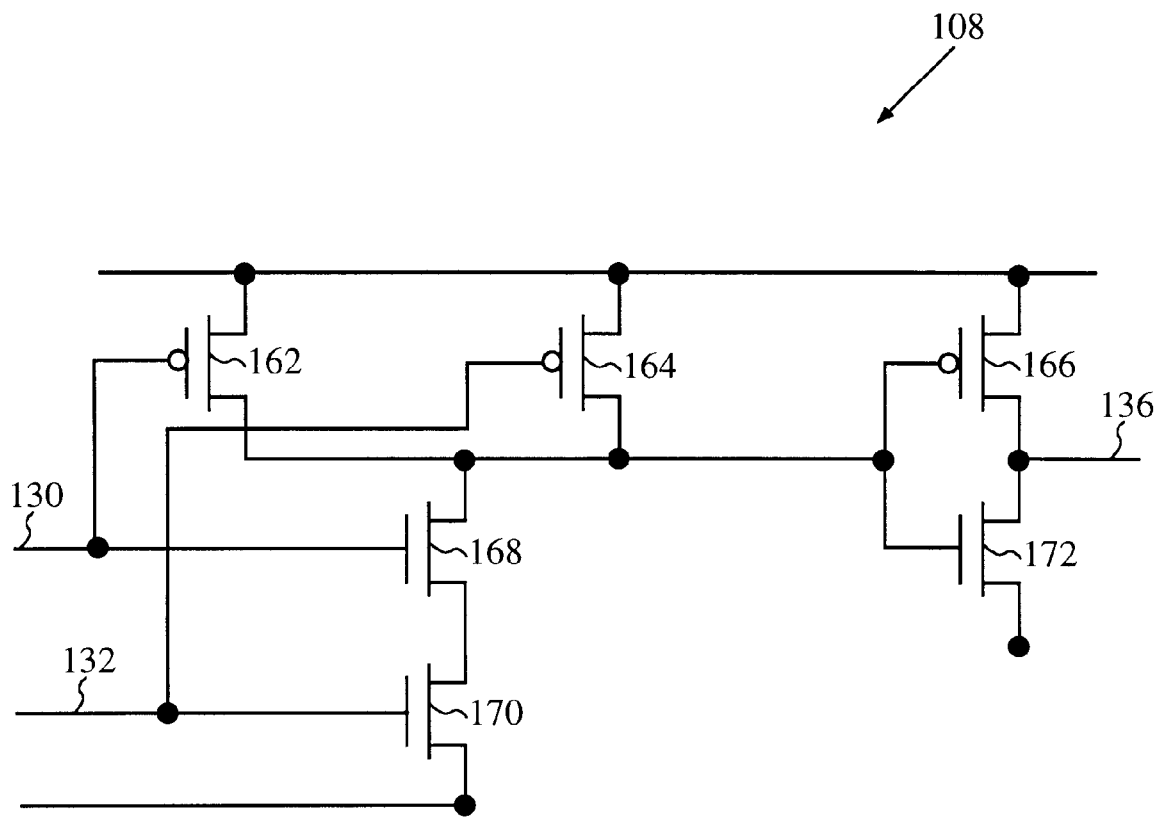
FIG. 3 is a schematic diagram of the AND gate of FIG. 1.

Accordingly, programmable logic circuit 200 advantageously requires only four transistors to provide both AND and exclusive NOR functions. This is a significant reduction in the number of transistors required to implement such a programmable logic circuit, when compared with logic circuit 100 (FIG. 1). Moreover, the present invention advantageously provides a programmable logic circuit that can be dynamically re-programmed to implement an exclusive NOR function during one clock cycle and an AND function during another clock cycle.

Figure 4:
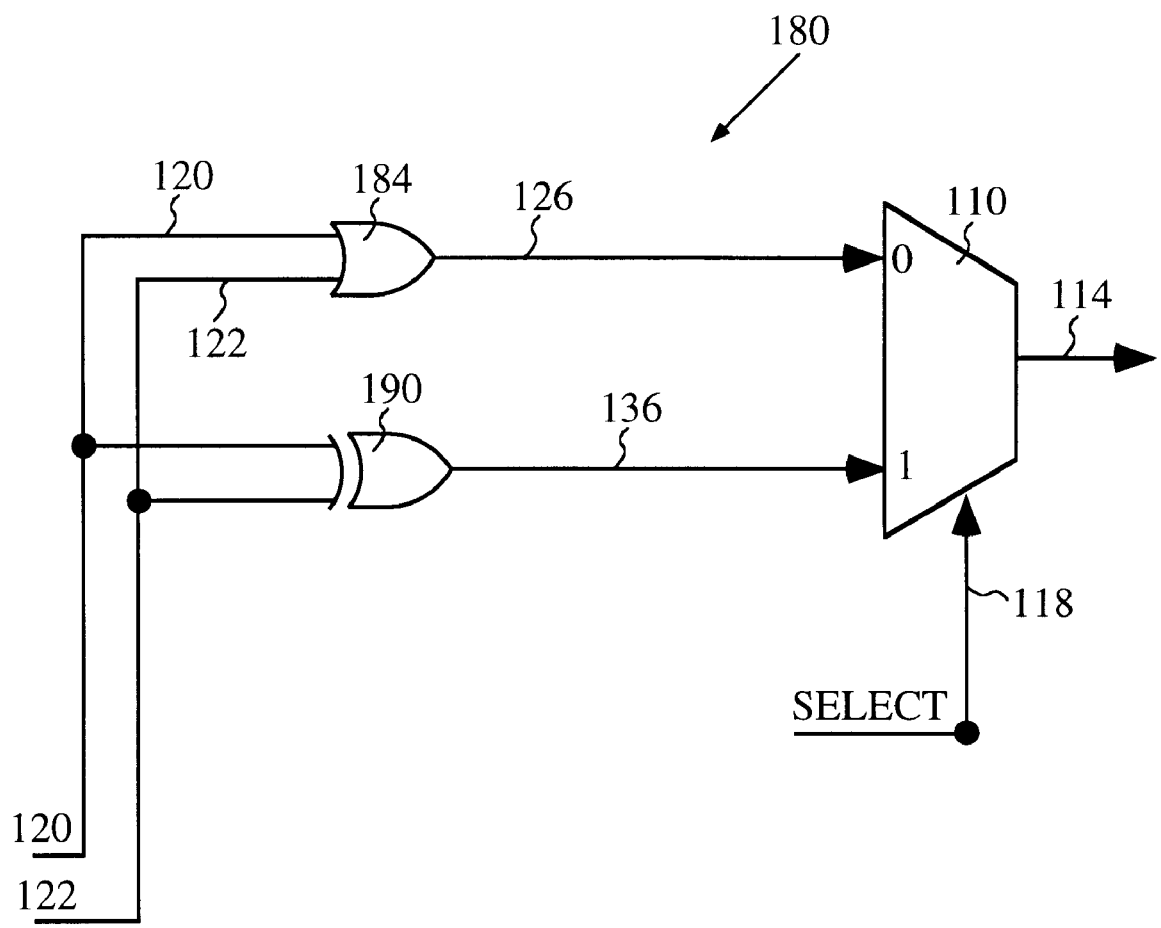
FIG. 4 is a schematic diagram of a conventional circuit for providing an exclusive OR function or an OR function.

The present invention can be extended to implement other logic functions using a reduced number of transistors. For example, as previously described, a conventional programmable logic circuit 180 (FIG. 4) which performs a logical OR function and a logical exclusive OR function typically requires fourteen transistors.

Figure 6:
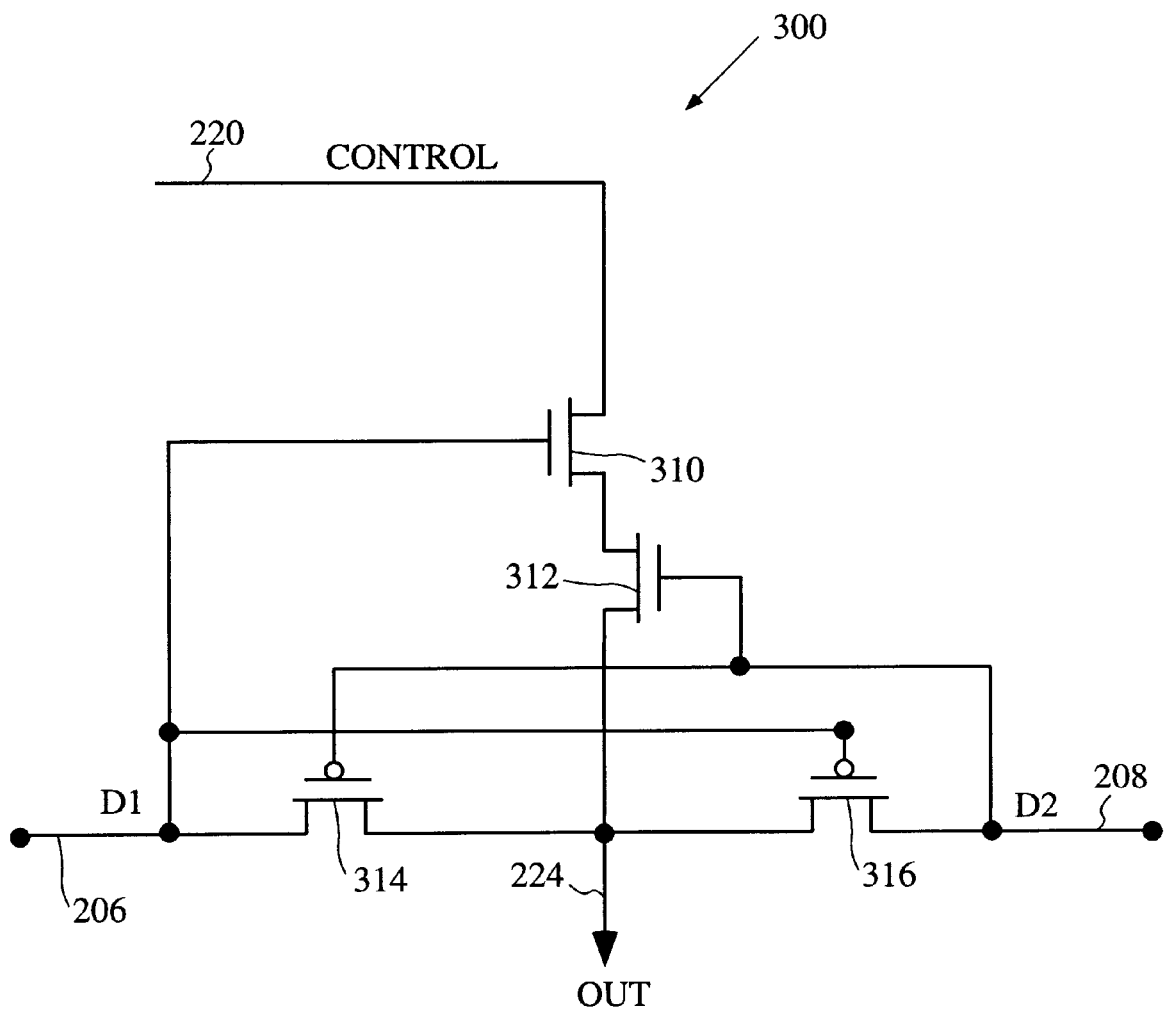
FIG. 6 is a schematic diagram of a programmable logic circuit for implementing an exclusive OR function or an OR function in accordance with one embodiment of the present invention.

FIG. 6 is a schematic diagram of a programmable logic circuit 300 which implements a logical OR function and an exclusive OR function in accordance with another embodiment of the invention. Programmable logic circuit 300 replaces the n-channel transistors 214 and 216 of programmable logic circuit 200 (FIG. 5) with p-channel transistors 314 and 316, and replaces the p-channel transistors 210 and 212 of programmable logic circuit 200 (FIG. 5) with n-channel transistors 310 and 312. As a result, logic circuit 300 implements a logical OR function when the CONTROL signal is asserted in a logic high state. Programmable logic circuit 300 implements a logical exclusive OR function when the CONTROL signal is asserted in a logic low state. Advantageously, programmable logic circuit 300 implements these logical functions using only four transistors.

Although the present invention has been described in connection with various embodiments, it is understood that the present invention is not limited to the embodiments disclosed, but is capable of various modifications which would be apparent to one of ordinary skill in the art. For example, the field effect transistors could be replaced with bipolar transistors of corresponding conductivity types. Accordingly, the present invention is limited only by the following claims.

I claim:

1. A logic circuit programmable to implement at least two logic functions comprising:

a first signal line for receiving a first input signal;

a second signal line for receiving a second input signal;

an output signal line for receiving an output signal;

a control signal line for receiving a control signal for programming the logic circuit, wherein the logic circuit implements a first logic function when the control signal is asserted in a first logical state, and the logic circuit implements a second logic function when the control signal is asserted in a second logical state; and a circuit having a first transistor, a second transistor, a third transistor and a fourth transistor, wherein the first transistor and the second transistor are connected in series between the control signal line and the output signal line, the third transistor is connected in series between the first input signal line and the output signal line, the fourth transistor is connected in series between the second input signal line and the output signal line, the first signal line is connected to gates of the first and fourth transistors, and the second signal line is connected to gates of the second and third transistors.

2. The logic circuit of claim 1, wherein the logic circuit includes exactly four transistors.

3. The logic circuit of claim 1, wherein the first and second transistors comprise p-channel field effect transistors, and the third and fourth transistors comprise n-channel field effect transistors.

4. The logic circuit of claim 1, wherein the first logic function is a logical AND function, and the second logic function is a logical exclusive NOR function.

5. The logic circuit of claim 1, wherein the first and second transistors comprise n-channel field effect transistors, and the third and fourth transistors comprise p-channel field effect transistors.

6. The logic circuit of claim 1, wherein the first logic function is a logical OR function, and the second logical function is a logical exclusive OR function.

7. A method of implementing a logic circuit which is programmable to implement a first logic function and a second logic function, the method comprising the steps of:

selecting a control signal to be in either a first logic state or a second logic state, wherein the logic circuit implements the first logic function when the control signal is in the first logic state and a second logic function when the control signal is in the second logic state;

transmitting the control signal to an output signal line when a first input signal and a second input signal are both in the first logic state;

transmitting the second input signal to the output signal line when the second input signal is in the first logic state and the first input signal is in the second logic state;

transmitting the first input signal to the output signal line when the first input signal is in the first logic state and the second input signal is in the second logic state; and transmitting both the first and second input signals to the output signal line when both the first input signal and the second input signal are in the second logic state.

8. The method of claim 7, wherein the first logic function is a logical AND function, and the second logic function is a logical exclusive NOR function.

9. The method of claim 7, wherein the first logic function is a logical OR function, and the second logic function is a logical exclusive OR function.

* * * * *